(12) United States Patent
Ni et al.

(10) Patent No.: US 6,461,974 B1
(45) Date of Patent: Oct. 8, 2002

(54) HIGH TEMPERATURE TUNGSTEN ETCHING PROCESS

(75) Inventors: Tuqiang Ni; Kenji Takeshita, both of Fremont; Thomas Choi, San Jose, all of CA (US)

(73) Assignee: Lam Research Corporation, Fremont, CA (US)

( * ) Notice: Subject to any disclaimer, the term of this patent is extended or adjusted under 35 U.S.C. 154(b) by 28 days.

(21) Appl. No.: 09/680,320

(22) Filed: Oct. 6, 2000

(51) Int. Cl.[7] ............................................. H01L 21/302
(52) U.S. Cl. ..................... 438/712; 438/714; 438/715; 438/717; 438/720
(58) Field of Search ................................ 438/712, 714, 438/715, 717, 720, 723, 725, 742

(56) References Cited

U.S. PATENT DOCUMENTS

| | | | |
|---|---|---|---|
| 4,340,462 A | 7/1982 | Koch | |
| 4,579,618 A | 4/1986 | Celestino et al. | 156/345 |
| 4,713,141 A * | 12/1987 | Tsang | 438/695 |
| 4,786,360 A | 11/1988 | Cote et al. | 438/673 |
| 4,797,178 A | 1/1989 | Bui et al. | 134/1.1 |
| 4,836,886 A | 6/1989 | Daubenspeck | 216/67 |
| 4,842,676 A | 6/1989 | Jucha et al. | |
| 4,842,687 A | 6/1989 | Jucha et al. | |
| 4,948,458 A | 8/1990 | Ogle | 438/729 |
| 4,948,462 A * | 8/1990 | Rossen | 438/16 |
| 5,013,680 A | 5/1991 | Lowrey et al. | |
| 5,108,542 A | 4/1992 | Lin | 438/720 |
| 5,198,718 A | 3/1993 | Davis et al. | 313/355.1 |
| 5,200,232 A | 4/1993 | Tappan et al. | 427/569 |
| 5,241,245 A | 8/1993 | Barnes et al. | 315/111.41 |
| 5,259,923 A | 11/1993 | Hori et al. | 216/66 |
| 5,304,279 A | 4/1994 | Coultas et al. | 315/111.41 |
| 5,401,350 A | 3/1995 | Patrick et al. | 156/321.5 |
| 5,591,301 A | 1/1997 | Grewal | 156/345 |
| 5,853,602 A * | 12/1998 | Shoji | 216/46 |
| 5,858,621 A | 1/1999 | Yu et al. | 156/643.1 |
| 5,882,992 A | 3/1999 | Kobeda et al. | 438/582 |
| 5,895,239 A | 4/1999 | Jeng et al. | 438/239 |
| 6,037,265 A | 3/2000 | Mui et al. | 438/719 |
| 6,080,680 A * | 6/2000 | Lee et al. | 438/727 |
| 6,191,045 B1 * | 2/2001 | Yoshigai et al. | 438/714 |
| 6,255,226 B1 * | 7/2001 | Zheng et al. | 438/734 |
| 6,261,934 B1 * | 7/2001 | Kraft et al. | 438/592 |
| 6,277,763 B1 * | 8/2001 | Kugimiya et al. | 438/720 |

* cited by examiner

Primary Examiner—Benjamin L. Utech
Assistant Examiner—Binh X. Tran
(74) Attorney, Agent, or Firm—Burns, Doane, Swecker & Mathis, LLP (57) ABSTRACT

A method of etching a tungsten film, comprising the steps of supporting a semiconductor substrate having a tungsten film thereon on a substrate support in an interior of a plasma etcher, supplying process gas to the interior of the plasma etcher, energizing the process gas into a plasma state, etching the tungsten film by exposing the substrate to the plasma, and heating the substrate to a temperature of at least 100° C. during the etching step. The etching step can include a low temperature main etch below 100° C. followed by a high temperature overetch above 100° C., the process gas including a fluorine containing gas during the main etch and a chlorine containing gas during the overetch. The tungsten film can be located over a dielectric film which serves as a stop layer during the etching step. The tungsten film can be pure tungsten and the dielectric layer can be a silicon oxide film having a thickness of 200 Å or less.

32 Claims, 5 Drawing Sheets

HIGH TEMPERATURE TUNGSTEN ETCHING PROCESS

FIELD OF THE INVENTION

The invention relates to improvements in plasma etching of tungsten. More particularly, the invention provides a high temperature tungsten etching process wherein a tungsten layer is selectively etched using a chlorine and oxygen plasma.

BACKGROUND OF THE INVENTION

Vacuum processing chambers are generally used for etching of materials on substrates by supplying process gas to the vacuum chamber and application of an RF field to the gas. Examples of parallel plate, transformer coupled plasma (TCP™, also called ICP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Substrate holders in the form of an electrode can supply radiofrequency (RF) power into the chamber, as disclosed in U.S. Pat. No. 4,579,618. Plasma processing systems wherein an antenna coupled to a radiofrequency (RF) source energizes gas into a plasma state within a process chamber are disclosed in U.S. Pat. Nos. 4,948,458; 5,198,718; 5,241,245; 5,304,279; and 5,401,350. In such systems, the antenna is located outside the process chamber and the RF energy is supplied into the chamber through a dielectric window. Such processing systems can be used for a variety of semiconductor processing applications such as etching, deposition, resist stripping, etc.

Plasma etching of tungsten is disclosed in U.S. Pat. Nos. 4,713,141; 4,842,676; 4,842,687; 5,259,923; and 5,882,992. Of these, the '141 patent discloses etching tungsten overlying a dielectric layer using a mixture of $SF_6$ and $Cl_2$ at a flow rate of 100 to 200 sccm, pressure of 200 to 400 mTorr, an electrode gap in a parallel plate plasma etcher of 0.6 to 1 cm, an electrode temperature of 20° C., and RF power of 150 to 275 watts supplied to the electrode. The '676 and '687 patents disclose selective etching of tungsten at ambient temperature with gas mixtures such as $SF_6$, HBr and a source of hydrocarbons. The background of the '923 patent states that fluorine containing gases such as $SF_6$ or a mixture of $SF_6$ and $CCl_4$ or $Cl_2$ have been used to etch tungsten but the selection ratio of such gases against silicon or silicon oxide is not sufficient. The '992 patent discloses etching of tungsten over chromium with a mixture of $SF_6$ and $CHCl_3$ followed by stripping the photoresist mask using a low temperature (<100° C.) plasma etch in $O_2$.

During etching of tungsten with fluorine, the reaction of tungsten with the fluorine atom forms volatile $WF_6$. However, because fluorine also attacks silicon oxide, etching of tungsten over silicon oxide with desired selectivity cannot be achieved by conventional plasma etch processes. Accordingly, it would be desirable for a plasma etch process to be capable of providing a desired degree of selectivity between the etch rate of a tungsten layer and an underlying silicon dioxide layer.

SUMMARY OF THE INVENTION

The invention provides a method of etching a tungsten film, comprising the steps of supporting a semiconductor substrate having a tungsten film thereon on a substrate support in an interior of a plasma etcher, supplying process gas to the interior of the plasma etcher, energizing the process gas into a plasma state, etching the tungsten film by exposing the substrate to the plasma, and heating the substrate to a temperature of at least 100° C. during the etching step.

During the process, the substrate can be heated to at least 200° C., preferably 300° C. to 400° C. The etching step can include a low temperature main etch below 100° C. followed by a high temperature overetch above 100° C., the process gas including a fluorine containing gas during the main etch and a chlorine containing gas during the overetch. Preferably, the overetch is carried out using $Cl_2$ and $O_2$ as the process gas. The tungsten film preferably overlies a dielectric film such as a silicon oxide film having a thickness of 200 Å or less. The tungsten film can be a pure tungsten film covered with a patterned resist film or patterned hard mask such as silicon dioxide or silicon nitride, the hard mask being preferred during the high temperature tungsten etching. For example, the hard mask can be an antireflective coating and the antireflective coating (ARC) can be covered with a patterned resist film, the method including plasma etching exposed portions of the ARC. Preferably, a radio frequency bias is applied to the substrate during the etching step, e.g., a radio frequency bias of 50 to 300 watts can be applied to the substrate during the etching step while maintaining the interior of the plasma etcher at a vacuum of less than 20 mTorr, preferably less than 10 mTorr. The plasma is preferably generated by an antenna which inductively couples radio frequency power into the interior of the plasma etcher, the antenna being supplied radio frequency power by a radio frequency source driven at a power level of 1000 watts or less, e.g., 300 to 700 watts. If desired, the process gas during the high temperature etch can include $Cl_2$ and $O_2$ or HBr and $Cl_2$ and the process gas during the low temperature etch can include $SF_6$, $N_2$ and $Cl_2$; $SF_6$ and $N_2$; or $CF_4$, $N_2$ and $Cl_2$.

BRIEF DESCRIPTION OF THE DRAWINGS

The invention will be described in greater detail with reference to the accompanying drawings in which like elements bear like reference numerals, and wherein:

FIGS. 2A–D are graphs showing effects on the silicon dioxide etch rate when changing pressure, oxygen flow, temperature and bias power while maintaining baseline chamber conditions wherein FIG. 2A shows the effects of varying chamber pressure, FIG. 2B shows the effects of changing oxygen flow, FIG. 2C shows the effects of changing bottom electrode temperature, and FIG. 2D shows the effects of changing bottom RF bias power; and FIGS. 3A–D are graphs showing effects on the tungsten and silicon dioxide etch rates when changing pressure, oxygen flow, bottom power and TCP™ power wherein FIG. 3A shows the effects of varying chamber pressure, FIG. 3B shows the effects of changing oxygen flow, FIG. 3C shows the effects of changing bottom electrode power (RF bias), and FIG. 3D shows the effects of changing top power (TCP™ power).

DETAILED DESCRIPTION OF THE PREFERRED EMBODIMENTS

The invention provides a tungsten plasma etching process which is effective in etching a tungsten layer at a desired etching rate while suppressing the etch rate of an overlying hard mask and/or underlying gate dielectric layer such as silicon dioxide or silicon oxynitride. In a preferred embodiment, the tungsten and gate oxydielectric form a gate structure wherein the tungsten layer is a pure tungsten film and the gate dielectric is a thin silicon dioxide or silicon oxynitride film.

According to the invention, an etching process has been developed to address a problem in etching gate structures. In particular, the etch process according to the invention provides desired selectivity in etching tungsten over silicon oxide, the tungsten replacing polysilicon of a gate structure of polysilicon over silicon dioxide. In addition to replacing polysilicon with tungsten, the silicon dioxide gate dielectric has been made thinner. It has been discovered that conventional tungsten etching processes are unsuitable for etching the tungsten over silicon dioxide gate structure because of lack of selectivity, i.e., fluorine based etch chemistries do not provide enough selectivity to etch tungsten and stop on a thin silicon dioxide layer because fluorine attacks tungsten and silicon. The invention overcomes this problem by using a high temperature etch process.

In order to etch a tungsten layer with desired selectivity to an underlying thin silicon dioxide layer, the invention provides a high temperature etch process wherein a chlorine plasma and low bias radio frequency (RF) power is applied to an electrode supporting the substrate to be etched. Under low temperature conditions (<100° C.) the etch rate of tungsten using $Cl_2$ as a process gas is too low to be acceptable in semiconductor processing. In order to increase the activation energy for the chlorine atoms to react with tungsten, high energy ions can be created by applying an RF bias to the electrode supporting the substrate to be etched. However, because a high RF bias accelerates ions to the substrate surface, the chlorine will attack the silicon dioxide and thus result in loss of selectivity.

In the high temperature etch process according to a preferred embodiment of the invention, a tungsten layer is etched in a chlorine plasma under high temperature conditions. The heat can be provided by a heated substrate support (e.g., an ESC incorporating a heater) which transfers enough heat (e.g., via He heat transfer gas supplied between the substrate being processed and the ESC) to the substrate being etched to activate the reaction of tungsten with chlorine atoms and form volatile $WCl_6$. On the other hand, because the etch rate of silicon oxide is more sensitive to ion energy than temperature, it is possible to maintain a desired selectivity by using low RF bias power. A preferred temperature for conducting the high temperature etch process according to the invention is in the range of 150 to 550° C., more preferably from 250 to 450° C., and most preferably from 300 to 400° C. Optionally, oxygen can be incorporated in the process gas to promote the tungsten etch by forming a volatile tungsten oxychloride $WOCl_4$. The addition of oxygen has been found to suppress the etch rate of silicon dioxide and thereby enhance the selectivity.

The tungsten etch process can be performed in any suitable plasma chamber. For example, the etch process can be carried out in a medium or high density plasma chamber such as a capacitively coupled and/or an inductively coupled etch chamber. A preferred inductively coupled chamber is a TCP™ plasma chamber available from Lam Research Corporation. When using a TCP™ chamber, general process conditions can be as follows: chamber pressure of less than 20 mTorr, top power (TCP™ coil) of 300 to 1000 watts, bottom power (RF bias of ESC supporting wafer to be etched) of less than 300 watts, temperature of ESC of 200 to 400° C., and process gas flows of 20 to 200 sccm $Cl_2$, up to 120 sccm $O_2$, up to 100 sccm $N_2$ and up to 100 sccm HBr. If it is desired to incorporate a low temperature tungsten etch prior to the high temperature etch, the process gas can include up to 100 sccm $SF_6$, up to 100 $CF_4$, and other gas constituents (including carrier gases such as Ar, He and the like) which do not adversely affect the desired etch profile of the tungsten layer. Any suitable substrate support can be used in practicing the high temperature etch process according to the invention, including the high temperature ESC disclosed in commonly owned U.S. Pat. No. 6,377,437, the disclosure of which is hereby incorporated by reference.

In order to explain development of the tungsten (W) etch process according to the invention, the following tests were carried out, the test results of which are provided merely for purposes of explanation and not by way of limitation. In these tests, the etch process was carried out using a TCP™ 2300 plasma etcher available from Lam Research Corporation and the test structure consisted of sequential layers from top to bottom of a 3400 Å DUV resist, a 200 Å silicon oxynitride DARC, a 1000 Å tungsten film, and a 100 Å $SiO_2$ film. In etching such a test structure, it was desired to produce a vertical tungsten (W) profile without notching while achieving a selective overetch (O/E).

Figure 1A:
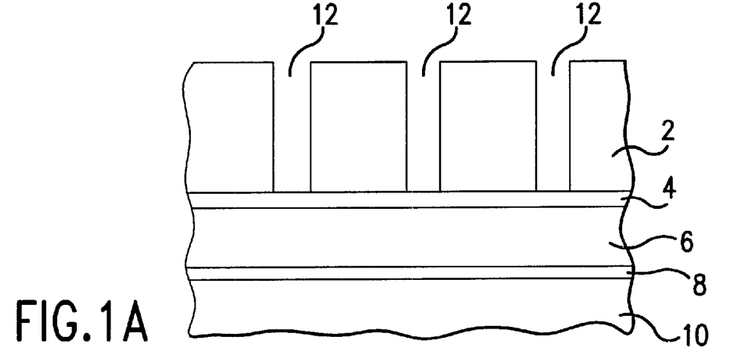
FIGS. 1A–D are representations of etched layers during sequential steps of etching a stack of layers including a photoresist layer (PR), an antireflective coating (ARC), a tungsten layer and a gate oxide layer, FIG. 1A showing the patterned photoresist, FIG. 1B showing the etched ARC, FIG. 1C showing the etched tungsten layer and FIG. 1D showing the etched gate oxide.
Figure 1B:
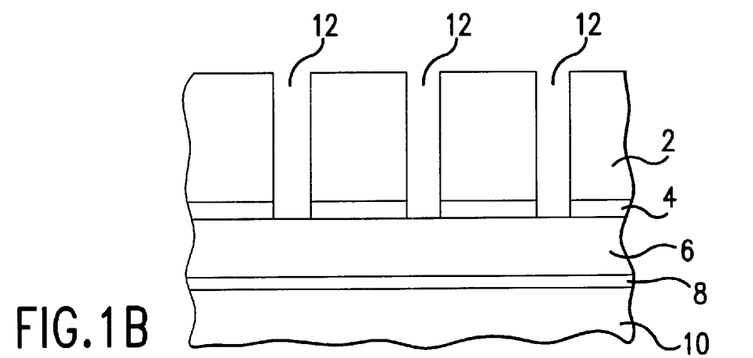
Figure 1C:
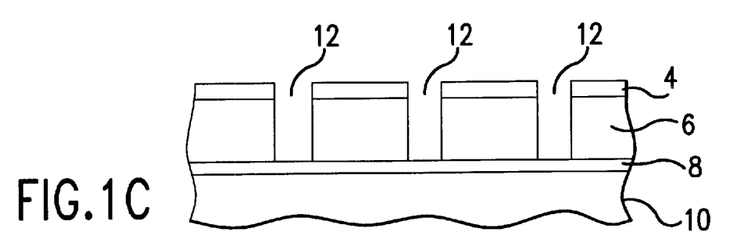
Figure 1D:
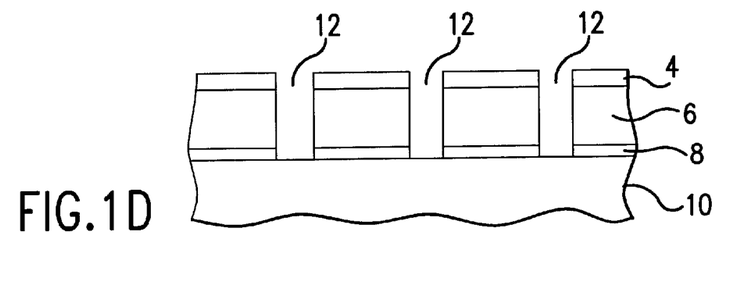

FIGS. 1A–D are representations of etched layers during sequential steps of etching a stack of layers including a photoresist layer (PR) 2, an antireflective coating (ARC) 4 such as a dielectric ARC (DARC), a tungsten layer 6 and a gate oxide layer 8 such as silicon dioxide or silicon oxynitride on a silicon substrate 10. As shown in FIG. 1A, openings 12 are provided in the photoresist layer 2, such openings 12 being formed by any suitable technique such as photolithography. FIG. 1B shows the results of plasma etching the ARC 4 such that the openings 12 extend to the tungsten layer 6. FIG. 1C shows the results of etching the tungsten layer 6 in a single step or multi-step plasma etching process, e.g., a main etch and an overetch. The high temperature etch according to the invention can be incorporated in the main etch and/or the overetch. However, it is desirable to remove the photoresist layer prior to the high temperature etch. For example, if the main etch is carried out at temperatures below 100° C. and only the overetch is carried out at high temperature, the photoresist can remain on the tungsten layer during the main etch and the photoresist can be removed prior to the high temperature overetch. FIG. 1D shows the results of plasma etching the gate oxide 8.

EXAMPLE 1

In a first test, a DARC (silicon oxynitride dielectric antireflective coating) was etched using a $SF_6/N_2$ main etch with $Cl_2/O_2$ overetch and it was found that the etch produced a tapered DARC profile with 2900 Å resist remaining. Next, the tungsten layer was etched for 30 seconds with a chamber pressure of 5 mTorr, 350 watts TCP™ power, 100 watts RF bias power, 50 sccm $SF_6$ and 50 sccm $N_2$ and it was found that the tungsten etch rate was 1466 Å/min and the photoresist "PR" etch rate was 2700 Å/min. The tungsten overetch was carried out with a chamber pressure of 5 mTorr, 300 watts TCP™ power, 100 watts RF bias power, 25 sccm $Cl_2$, 40 sccm $O_2$ and 80 sccm He and it was found that residual tungsten was not removed during the low temperature overetch. During the DARC etch, the main tungsten etch and the tungsten overetch steps, the chamber temperature was 60° C. and the bottom electrode temperature was 65° C.

EXAMPLE 2

The next test was carried out using a $SF_6/N_2$ tungsten etch with lower bottom electrode temperature. The DARC etch was carried out with 10 mTorr chamber pressure, 450 watts TCP™ power, 80 watts RF bias power and 100 sccm $CF_4$. It was found that the gate oxide was punched through and the tungsten etch rate was 1466 Å/min when the lower electrode temperature was 50° C. and the chamber conditions included a chamber pressure of 5 mTorr, 350 watts TCP™ power, 100 watts RF bias power, 50 sccm $SF_6$ and 50 sccm $N_2$.

EXAMPLE 3

A $Cl_2/O_2$ overetch matrix-feasibility test was carried out after performing the DARC etch in a low temperature etch chamber at 65° C. under conditions of 10 mTorr chamber pressure, 450 watts TCP™ power, 80 watts RF bias, 100 sccm $CF_4$ whereby the desired pattern was formed in the DARC. Subsequently the photoresist was stripped by a conventional technique. Then the wafer was loaded into a high temperature chamber for etching the tungsten using the DARC as a mask. A 5 second tungsten break-through step was carried out in the high temperature chamber (bottom electrode at same temperature used for the tungsten etch) with 5 mTorr chamber pressure, 450 watts TCP™ power, 100 watts RF bias and 100 sccm $Cl_2$. The tungsten etch was then carried out with a chamber pressure of 5 mTorr, 450 watts TCP™ power, 50 (target but actual value much lower) watts RF bias power, 70 sccm $Cl_2$ and 10 sccm $O_2$ (bottom electrode at 300° C. and W etch rate of 600 Å/min) and it was found that mask selectivity was insufficient since the mask was removed. Repeating the tungsten etch under the same conditions but with a chamber pressure of 20 mTorr resulted in minimal mask remaining and a tungsten etch rate of 500 Å/min. Repeating the test under the same conditions but with higher oxygen (20 sccm $O_2$) resulted in 200 Å mask remaining and a tungsten etch rate of 700 Å/min. In a test to determine the effects of higher temperature, the tungsten etch was carried out under the same conditions but with the bottom electrode at 400° C. and it was found that 100 Å mask remained and the tungsten etch rate was 500 Å/min.

EXAMPLE 4

Figure 2A:
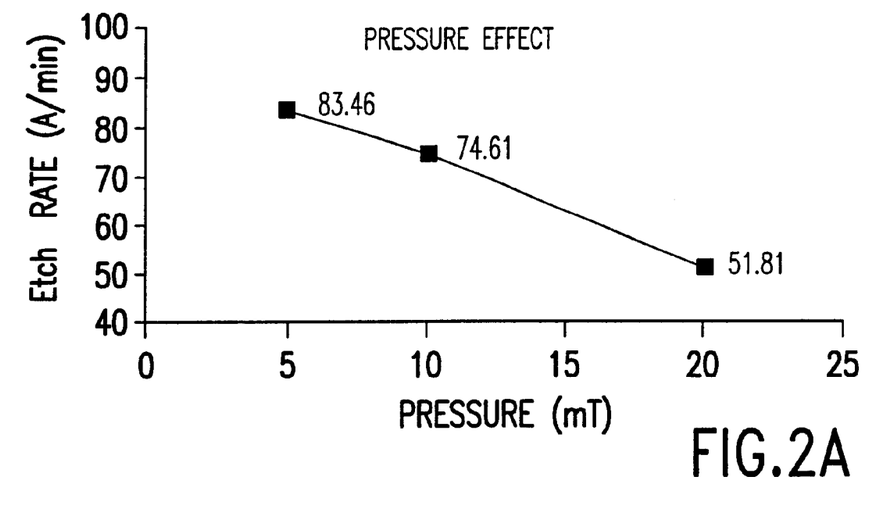
Figure 2B:
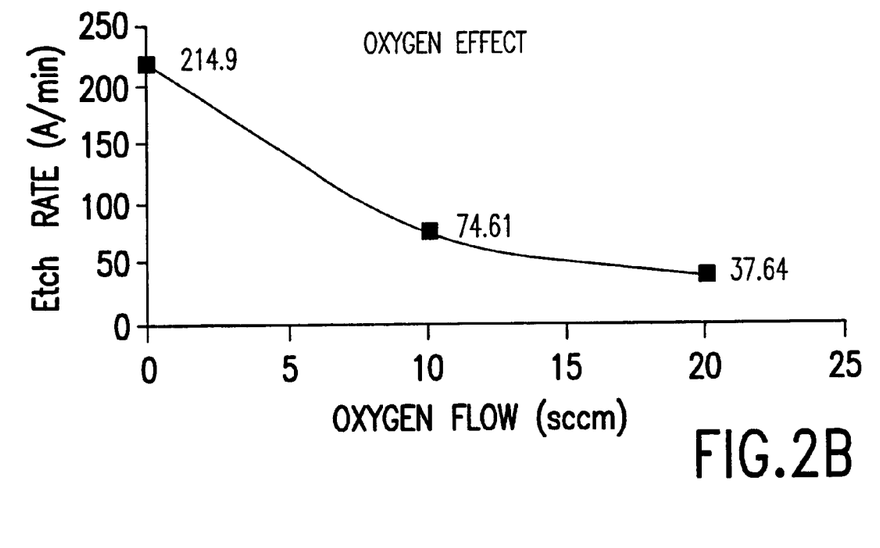
Figure 2C:
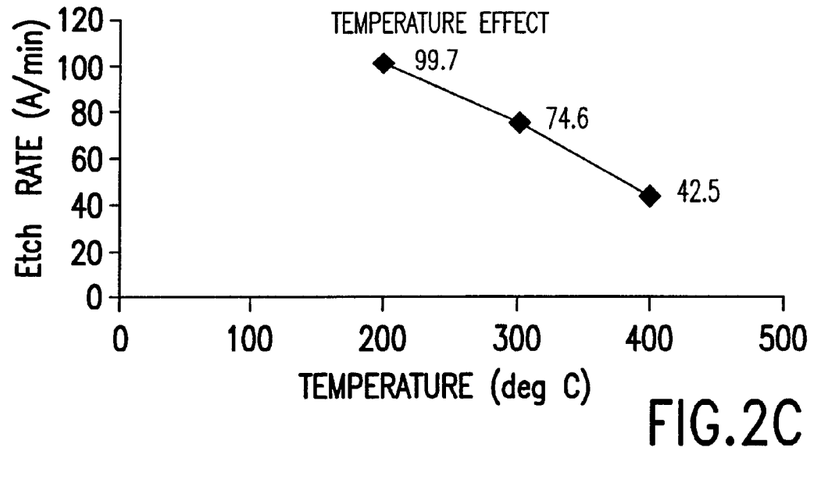
Figure 2D:
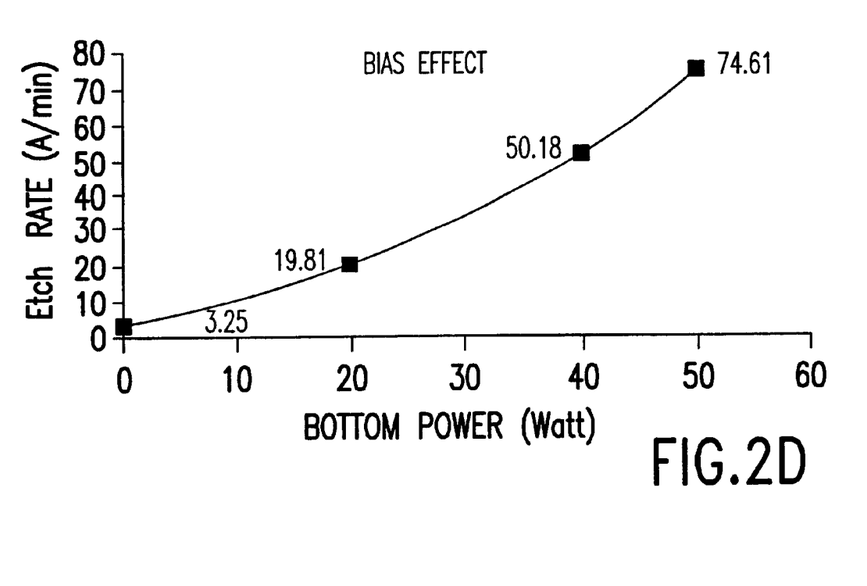

FIGS. 2A–D are graphs showing effects on the silicon dioxide etch rate when changing pressure, oxygen flow, temperature and bias power while maintaining baseline chamber conditions of 10 mTorr chamber pressure, 450 watts TCP™ power, 50 watts RF bias power, 70 sccm $Cl_2$, 10 sccm $O_2$, 300° C. bottom electrode temperature and 120 seconds etching time. FIG. 2A shows the effects of varying chamber pressure, FIG. 2B shows the effects of changing oxygen flow, FIG. 2C shows the effects of changing bottom electrode temperature, and FIG. 2D shows the effects of changing bottom RF bias power. As can be seen from these graphs, the Siq etch rate decreases from about 84 to 52 Å/min when chamber pressure increases from 5 to 20 mTorr, the $SiO_2$ etch rate decreases from about 215 to 38 Å/min when the oxygen flow increases from 0 to 20 sccm, the $SiO_2$ etch rate decreases from about 100 to 43 Å/min when the temperature of the bottom electrode increases from 200 to 400° C., and the $SiO_2$ etch rate increases from about 3 to 75 Å/min when the bottom RF bias power increases from 0 to 50 watts.

EXAMPLE 5

In a $Cl_2/O_2$ etch with 100% overetch test, the DARC etch was carried out in a low temperature chamber (bottom electrode at 65° C.) with a chamber pressure of 10 mTorr, 450 watts TCP™ power, 80 watts RF bias power, 50 sccm $CF_4$. A break through step was carried out in a high temperature chamber for 5 seconds with a chamber pressure of 5 mTorr, 450 watts TCP™ power, 100 watts RF bias power, 100 sccm $Cl_2$ and an overetch was carried out for 60 seconds with a chamber pressure of 10 mTorr, 450 watts TCP™ power, 20 watts RF bias power, 70 sccm $Cl_2$, 20 sccm $O_2$ (bottom electrode temperature 250° C.) followed by a 60 seconds overetch under the same conditions but with the bottom electrode raised to 300° C. This etch process resulted in lack of pitting, a remaining gate oxide of 96 Å, no tungsten residue and 200 Å DARC remaining.

EXAMPLE 6

Figure 3A:
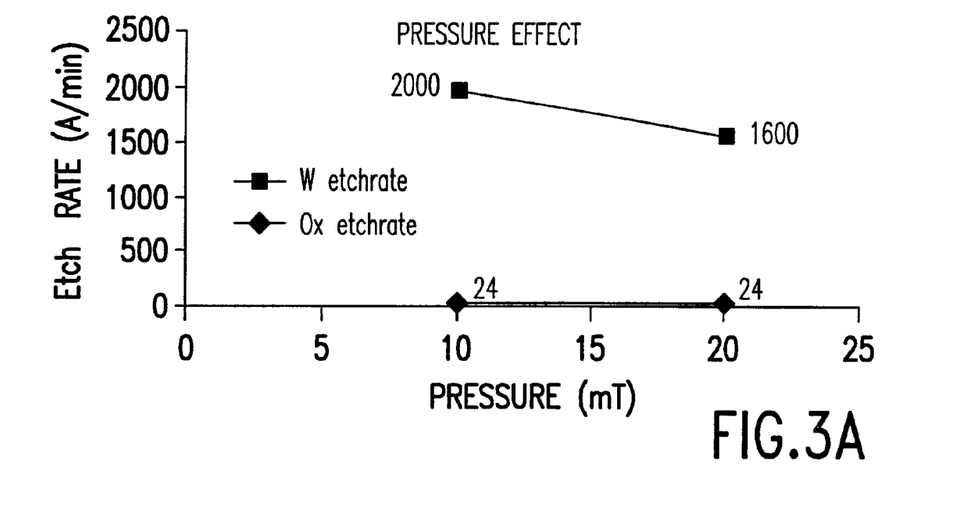
Figure 3B:
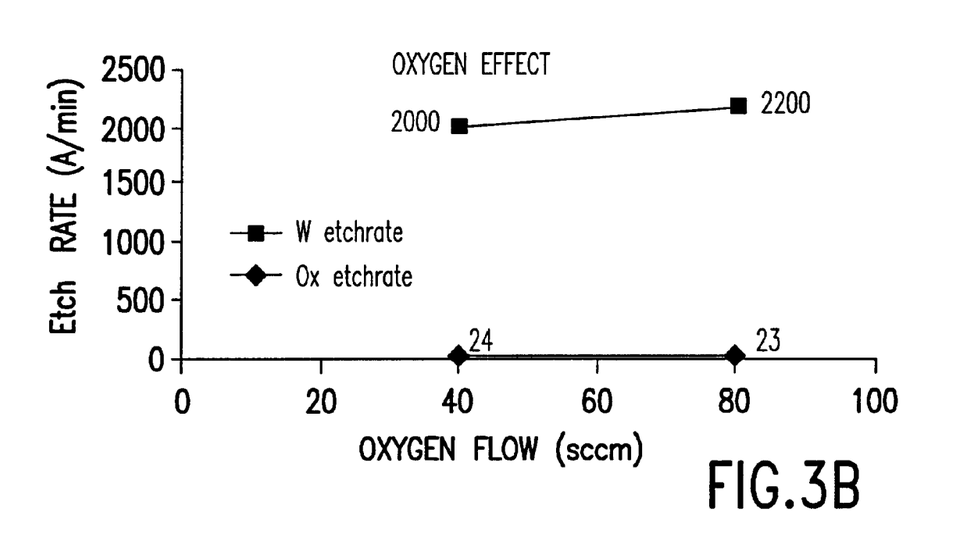
Figure 3C:
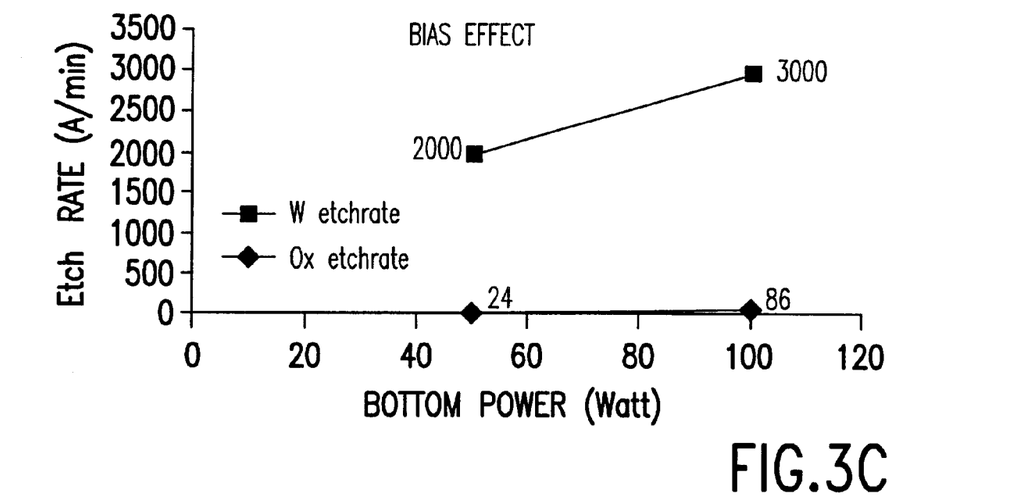
Figure 3D:
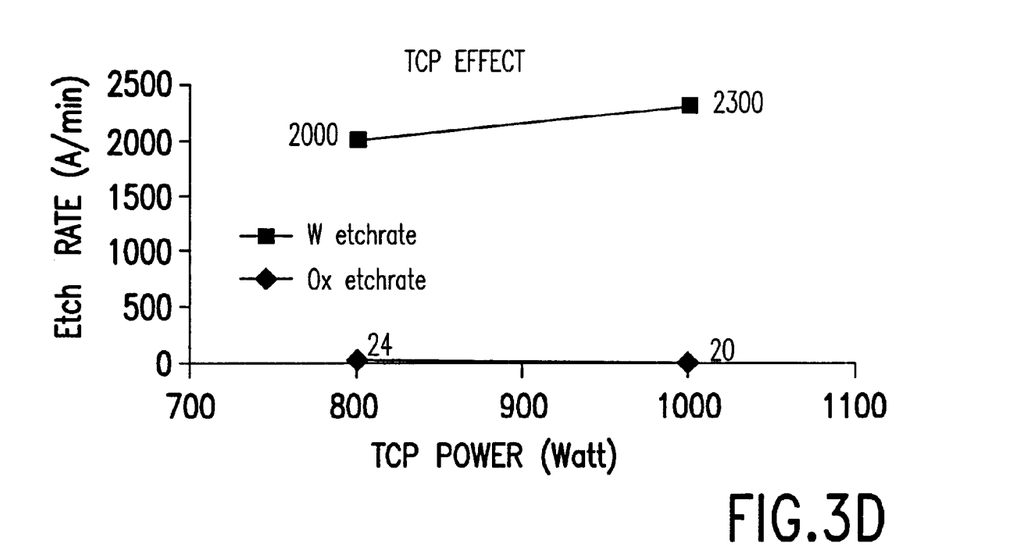

FIGS. 3A–D are graphs showing effects on the tungsten and silicon dioxide etch rates when changing pressure, oxygen flow, bottom power and TCP™ power while maintaining baseline chamber conditions of 10 mTorr chamber pressure, 800 watts TCPm power, 50 watts RF bias power, 140 sccm $Cl_2$, 40 sccm $O_2$, 300° C. bottom electrode temperature and 60 seconds etching time. FIG. 3A shows the effects of varying chamber pressure, FIG. 3B shows the effects of changing oxygen flow, FIG. 3C shows the effects of changing bottom electrode power (RF bias), and FIG. 3D shows the effects of changing top power (TCP™ power). As can be seen from these graphs, the tungsten etch rate decreases from 2000 to 1600 Å/min and the $SiO_2$ etch rate is essentially unchanged from 24 to 23 Å/min when chamber pressure increases from 10 to 20 mTorr, the tungsten etch rate increases from 2000 to 2200 Å/min and the $SiO_2$ etch rate is at 24 Å/min when the oxygen flow increases from 40 to 80 sccm, the tungsten etch rate increases from 2000 to 3000 Å/min and the $SiO_2$ etch rate increases from 24 to 86Å/min when the bottom power (RF bias) increases from 50 to 100 watts, and the tungsten etch rate increases from 2000 to 2300 Å/min and the $SiO_2$ etch rate decreases slightly from 24 to 20 Å/min when the TCP™ power increases from 800 to 1000 watts.

EXAMPLE 7

In a higher power/higher flow $Cl_2/O_2$ etch with initial overetch test, the DARC etch was carried out in a low temperature chamber with a chamber pressure of 10 mTorr, 450 watts TCPM power, 80 watts RF bias power, 100 sccm $CF_4$. The break through step was carried out for 5 seconds in a high temperature chamber with a chamber pressure of 5 mTorr, 450 watts TCP™ power, 100 watts RF bias power, 100 sccm $Cl_2$ (bottom electrode at 250° C.) and the main etch was carried out using an endpoint detection with a chamber pressure of 10 mTorr, 800 watts TCP™ power, 50 watts RF bias power, 140 sccm $Cl_2$, 40 sccm $O_2$ and bottom electrode temperature of 300° C. Using an endpoint at 27 seconds with 3 seconds overetch, it was found that the tungsten etch rate was 2222 Å/min, the oxide remaining was 98 Å and the mask still remained. In a test using the same conditions but with a RF bias of 100 watts (endpoint at 18 seconds with 2 seconds overetch), it was found that the tungsten etch rate was 3333 Å/min, the oxide remaining was 98 Å, and the mask was gone.

EXAMPLE 8

In a higher power/higher flow $Cl_2/O_2$ etch with minimal overetch test, the DARC etch was carried out in a low temperature chamber with a chamber pressure of 10 mTorr, 450 watts TCP™ power, 80 watts RF bias power, 100 sccm $CF_4$. The break through step was carried out in a high temperature chamber for 5 seconds with a chamber pressure of 5 mTorr, 450 watts TCP power, 100 watts RF bias power, 100 sccm $Cl_2$ (bottom electrode at 250° C.) and the main etch was carried out using endpoint detection with a chamber pressure of 10 mTorr, 50 watts RF bias power, 140 sccm $Cl_2$, 40 sccm $O_2$ and bottom electrode temperature of 300° C. (endpoint at 20 seconds with 7 seconds overetch). It was found that the tungsten etch rate was 3000 Å/min, the oxide remaining was 98 Å and the mask was still intact. In a test using the same conditions but with 80 sccm $O_2$ and 800 watts TCP™ power (endpoint at 20 seconds with 7 seconds overetch) it was found that the tungsten etch rate was 3000 Å/min, the oxide remaining was 99 Å and the mask was still intact.

EXAMPLE 9

In a higher power/higher flow $Cl_2/O_2$ etch test, the DARC etch was carried out in a low temperature chamber with a chamber pressure of 10 mTorr, 450 watts TCP™ power, 80 watts RF bias power, 100 sccm $CF_4$. The break through step was carried out in a high temperature chamber for 5 seconds with a chamber pressure of 5 mTorr, 450 watts TCPM power, 100 watts RF bias power, 100 sccm $Cl_2$ (bottom electrode at 300° C.) and the main etch was carried out using an endpoint detection with a chamber pressure of 10 mTorr, 800 watts TCP™ power, 60 watts RF bias power, 140 sccm $Cl_2$, 100 sccm $O_2$ and bottom electrode temperature of 300° C. (endpoint at 30 seconds with 100% overetch). It was found that the tungsten etch rate was 2000 Å/min and the oxide remaining was at least 87 Å. In measurements of the remaining oxide from left to right (L–R) across the wafer and from top to bottom (T–B), the remaining oxide values were: 92, 93, 92, 90 and 88 Å (L–R) and 87,91,92, 91 and 88 Å (T–B).

EXAMPLE 10

In a $HBr/Cl_2/O_2$ etch test, the DARC etch was carried out in a low temperature chamber with a chamber pressure of 10 mTorr, 450 watts TCP power, 80 watts RF bias power, 100 sccm $CF_4$. The break through step was carried out in a high temperature chamber for 5 seconds with a chamber pressure of 5 mTorr, 450 watts TCP™ power, 100 watts RF bias power, 100 sccm $Cl_2$ (bottom electrode at 300° C.) and the main etch was carried out using an endpoint detection with a chamber pressure of 10 mTorr, 800 watts TCP™ power, 60 watts RF bias power, 40 sccm HBr, 100 sccm $Cl_2$, 100 sccm $O_2$ and bottom electrode temperature of 300° C. (endpoint at 23 seconds with 7 seconds overetch). It was found that the oxide remaining was 94 Å. In a test under the same conditions but with 140 sccm $Cl_2$ and 60 sccm $O_2$ during the main etch and 140 sccm $Cl_2$ and 100 sccm $O_2$ during the overetch (endpoint at 20 seconds and 20 seconds overetch), it was found that the oxide remaining was 79 Å. In a test under the same conditions but with 40 sccm HBr, 100 sccm $Cl_2$ and 100 sccm $O_2$ during the main etch and 100% overetch (endpoint at 23 seconds and 23 seconds overetch), it was found that the oxide remaining was 85 Å. In a test under the same conditions but with 140 sccm $Cl_2$ and 60 sccm $O_2$ during the main etch and 40 sccm HBr, 100 sccm $Cl_2$ and 100 sccm $O_2$ during the overetch (endpoint at 20 seconds and 25 seconds overetch), it was found that the oxide remaining was 87 Å.

EXAMPLE 11

In a $HBr/Cl_2/O_2$ overetch test, the main etch was carried out in a low temperature chamber for 30 seconds using a chamber pressure of 3 mTorr, 400 watts TCP™ power, 150 watts RF bias power, 80 sccm $CF_4$, 60 sccm $N_2$, 40 sccm $Cl_2$, and bottom electrode temperature of 30° C. and the overetch was carried out in a high temperature chamber with endpoint detection using a chamber pressure of 10 mTorr, 800 watts TCP™ power, 60 watts RF bias power, 100 sccm $Cl_2$, 40 sccm HBr, 100 sccm $O_2$, and bottom electrode temperature of 300° C. (endpoint at 12 seconds with 28 seconds additional overetching). It was found that the oxide remaining was 87 Å and the tungsten main etch rate was 1000 Å/min.

EXAMPLE 12

In a $SF_6/N_2$ main etch followed by a $HBr/Cl_2/O_2$ overetch test, the main etch was carried out in a low temperature chamber for 30 seconds using a chamber pressure of 3 mTorr, 350 watts TCP™ power, 150 watts RF bias power, 50 sccm $SF_6$, 50 sccm $N_2$, and bottom electrode temperature of 30° C. and the overetch was carried out in a high temperature chamber for 40 seconds with 160% additional overetching using a chamber pressure of 10 mTorr, 800 watts TCP power, 60 watts RF bias power, 100 sccm $Cl_2$, 40 sccm HBr, 100 sccm $O_2$, and bottom electrode temperature of 300° C. It was found that the oxide remaining was 65 Å, the openings had a profile around 90°, the tungsten main etch rate was 2000 Å/min, and the openings had a smooth bottom surface.

As a result of the foregoing tests, it has been determined that the use of a chlorine and oxygen containing plasma is feasible for tungsten overetching while stopping on a thin gate oxide in a high temperature electrode chamber. In the case where a polysilicon layer is between the gate dielectric and tungsten layers, the tungsten etch can be stopped on the polysilicon layer since the high temperature tungsten etch process according to the invention will spontaneously oxidize the polysilicon layer and desired etch rate selectivity of the oxidized layer can be achieved with the process of the invention. Further, it is possible to maintain a desired selectivity of tungsten to mask and gate oxide using $Cl_2/O_2$ as high as 100:1 while maintaining an etch rate of tungsten as high as 3000 Å/min. It has further been found that HBr promotes sidewall passivation and higher RF bias during the main etch using $SF_6/N_2$ provides a straighter profile.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of etching a tungsten film, comprising the steps of:
   supporting a semiconductor substrate having thereon a tungsten film, an antireflective coating covering the tungsten film, and a patterned resist film covering the antireflective coating, on a substrate support in an interior of a plasma etcher;
   supplying process gas to the interior of the plasma etcher;
   energizing the process gas into a plasma state;
   etching exposed portions of the antireflective coating by exposing the exposed portions to plasma at a temperature below 100° C.;
   etching the tungsten film by exposing the substrate to plasma; and
   heating the substrate to a temperature of at least 100° C. during the etching of the tungsten film.
2. The method of claim 1, wherein the substrate is heated to at least 200° C.
3. The method of claim 1, wherein the substrate is heated to 300° C. to 400° C.
4. The method of claim 1, wherein the tungsten film overlies a dielectric film which serves as a stop layer during the etching of the tungsten film.
5. The method of claim 1, wherein the tungsten film overlies a silicon oxide or silicon oxynitride film having a thickness of 200 Å or less.
6. The method of claim 1, wherein the tungsten film is a pure tungsten film covered with a patterned resist or hard mask.
7. The method of claim 1, wherein the method includes plasma etching the exposed portions of the antireflective coating using a fluorine containing process gas.
8. The method of claim 1, wherein a radio frequency bias is applied to the substrate during the etching of the tungsten film.
9. The method of claim 1, wherein a radio frequency bias of 50 to 300 watts is applied to the substrate during the etching of the tungsten film.
10. The method of claim 1, wherein the interior of the plasma etcher is maintained at a vacuum of less than 20 mTorr during the etching of the tungsten film.
11. The method of claim 1, wherein the interior of the plasma etcher is maintained at a vacuum of less than 10 mTorr during the etching of the tungsten film.
12. The method of claim 1, wherein the plasma is generated by an antenna which inductively couples radio frequency power into the interior of the plasma etcher, the antenna being supplied radio frequency power by a radio frequency source driven at a power level of 1000 watts or less.
13. The method of claim 1, wherein the plasma is generated by an antenna which inductively couples radio frequency power into the interior of the plasma etcher, the antenna being supplied radio frequency power by a radio frequency source driven at a power level of 300 to 700 watts.
14. The method of claim 1, wherein the tungsten layer overlies a gate oxide and a patterned hard mask overlies the tungsten layer, the process gas includes $Cl_2$ and $O_2$ and is more selective to tungsten than to oxide.
15. The method of claim 1, wherein the process gas includes HBr and $Cl_2$.
16. The method of claim 1, wherein the tungsten layer overlies a gate oxide, the method further including plasma etching the tungsten film using $SF_6$, $N_2$ and $Cl_2$ as process gas but with the substrate at a temperature of less than 100° C.
17. The method of claim 1, wherein the tungsten layer overlies a gate oxide, the method further including plasma etching the tungsten film using $SF_6$ and $N_2$ as process gas but with the substrate at a temperature of less than 100° C.
18. The method of claim 1, wherein the tungsten layer overlies a gate oxide, the method further including plasma etching the tungsten film using $CF_4$, $N_2$ and $Cl_2$ as process gas but with the substrate at a temperature of less than 100° C.
19. The method of claim 1, wherein the etching of the tungsten film includes a low temperature main etch below 100° C. followed by a high temperature overetch above 100° C., the process gas including a fluorine containing gas during the main etch and a chlorine containing gas during the overetch.
20. The method of claim 19, wherein the overetch is carried out using $Cl_2$ and $O_2$ as the process gas.
21. A method of etching a tungsten film, comprising:
   supporting a semiconductor substrate having a tungsten film thereon on a substrate support in an interior of a plasma etcher;
   supplying a first process gas to the interior of the plasma etcher;
   energizing the first process gas to form a first plasma;
   etching the tungsten film by exposing the substrate to the first plasma while the substrate is at a first temperature;
   then supplying a second process gas different from the first process gas to the interior of the plasma etcher;

energizing the second process gas to form a second plasma; and etching the tungsten film by exposing the substrate to the second plasma while the substrate is at a second temperature higher than the first temperature, wherein at least the second temperature is at least 100° C., and wherein at least the second process gas contains chlorine.

22. The method of claim 21, wherein the first temperature is below 100° C.

23. The method of claim 21, wherein the second temperature is from 300° C. to 400° C.

24. The method of claim 21, wherein:

the first temperature and the second temperature are at least 100° C.; and the first process gas and the second process gas contain chlorine.

25. The method of claim 21, wherein:

the tungsten film is covered with an antireflective coating; and the antireflective coating is covered with a patterned resist film.

26. The method of claim 21, wherein:

the first process gas contains fluorine; and the first temperature is below 100° C.

27. The method of claim 26, wherein the second process gas comprises $Cl_2$ and $O_2$.

28. The method of claim 26, wherein the tungsten film covers a dielectric film which serves as a stop layer during etching of the tungsten film with the second plasma.

29. The method of claim 28, wherein the dielectric film is a silicon oxide or silicon oxynitride film.

30. A method of etching a tungsten film, comprising:

supporting a semiconductor substrate having thereon a first film selected from the group consisting of a silicon oxide film and a silicon oxynitride film, and a tungsten film directly on the first film, on a substrate support in an interior of a plasma etcher;

supplying a first process gas containing fluorine to the interior of the plasma etcher;

energizing the first process gas to form a first plasma;

etching the tungsten film by exposing the substrate to the first plasma while the substrate is at a first temperature below 100° C.;

then supplying a second process gas containing chlorine to the interior of the plasma etcher;

energizing the second process gas to form a second plasma; and etching the tungsten film by exposing the substrate to the second plasma while the substrate is at a second temperature above 100° C., the first film serving as a stop layer during the etching.

31. The method of claim 30, wherein the second process gas comprises $Cl_2$ and $O_2$.

32. The method of claim 30, wherein:

the tungsten film is covered with an antireflective coating; and the antireflective coating is covered with a patterned resist film.

* * * * *